(12) United States Patent
Huber et al.

(10) Patent No.: US 7,393,721 B2
(45) Date of Patent: Jul. 1, 2008

(54) SEMICONDUCTOR CHIP WITH METALLIZATION LEVELS, AND A METHOD FOR FORMATION IN INTERCONNECT STRUCTURES

(75) Inventors: Andreas Huber, München (DE);
Günter Gerstmeier, Hilg.-Tandern (DE); Michael Bernhard Sommer, Raubling (DE)

(73) Assignee: Infineon Technologies AG, Munich (DE)

( * ) Notice: Subject to any disclaimer, the term of this patent is extended or adjusted under 35 U.S.C. 154(b) by 264 days.

(21) Appl. No.: 11/127,782

(22) Filed: May 12, 2005

(65) Prior Publication Data
US 2005/0263894 A1 Dec. 1, 2005

(30) Foreign Application Priority Data
May 12, 2004 (DE) .................. 10 2004 023 462

(51) Int. Cl.
*H01L 21/82* (2006.01)
(52) U.S. Cl. .................. 438/131; 438/600; 438/622; 257/E21.595
(58) Field of Classification Search ............. 438/131, 438/600, 622; 257/E21.595
See application file for complete search history.

(56) References Cited

U.S. PATENT DOCUMENTS

| | | | |
|---|---|---|---|
| 4,916,514 A | | 4/1990 | Nowak |
| 5,793,095 A | * | 8/1998 | Harvey .................. 257/530 |
| 5,904,556 A | | 5/1999 | Suzuki et al. |
| 5,923,960 A | * | 7/1999 | Harvey .................. 438/131 |
| 5,933,704 A | * | 8/1999 | Hwang et al. ............ 438/14 |
| 6,069,076 A | * | 5/2000 | Takahashi .............. 438/660 |
| 6,197,621 B1 | * | 3/2001 | Harvey .................. 438/131 |
| 6,458,630 B1 | * | 10/2002 | Daubenspeck et al. .... 438/131 |
| 2002/0182837 A1 | * | 12/2002 | Daubenspeck et al. .... 438/601 |
| 2003/0205816 A1 | * | 11/2003 | Janke .................... 257/758 |

FOREIGN PATENT DOCUMENTS

WO  WO 90/03046 A1  3/1990

* cited by examiner

*Primary Examiner*—Michael S. Lebentritt
*Assistant Examiner*—Stanetta D Isaac
(74) *Attorney, Agent, or Firm*—Slater & Matsil, L.L.P.

(57) ABSTRACT

A metallization surface (5), which acts as an etching stop layer during the production of openings (4) in a passivation layer (3) applied to its upper face and protects an interconnect structure (6) arranged underneath it, is arranged in an uppermost metallization level (1). A further opening is produced in the metal surface (5), through which a focused ion beam is aimed at the interconnect structure (6) in order to connect interconnects to one another and/or to interrupt at least one interconnect. The wiring of the integrated circuit can thus be varied individually, starting from identically produced semiconductor chips.

5 Claims, 2 Drawing Sheets

SEMICONDUCTOR CHIP WITH METALLIZATION LEVELS, AND A METHOD FOR FORMATION IN INTERCONNECT STRUCTURES

This application claims priority to German Patent Application 102004023462.0, which was filed May 12, 2004 and is incorporated herein by reference.

TECHNICAL FIELD

The present invention relates generally to semiconductor devices and more particularly to a semiconductor chip with metallization levels, and a method for formation of interconnect structures.

BACKGROUND

In semiconductor technology, it is often necessary to change the circuitry of the integrated electronic circuits on semiconductor chips retrospectively to a certain extent. These may be changes that affect only those circuit components that are provided for test purposes. The design of the circuit should thus be as flexible as possible in order to make it possible to produce the required variants of the wiring without any fundamental change to the component structure. It is thus particularly desirable to design the wiring that is provided in the metallization levels on the upper face of the semiconductor chip so that it can be varied in such a way that circuit parts can be adapted to different functions of the circuit with relatively minor modifications. In particular, it is thus possible to activate different test circuits or to provide alternative circuit functions during the production of the semiconductor chips.

However, the flexible circuit design leads to these circuits, including the intended alternatives, occupying more space on the semiconductor chip than is the case with an electronic circuit that is restricted to one specific method of operation. The greater the number of options that are kept open, the larger the surface area required for the circuit generally is.

One possible way to design the electrical connections of the circuit components from the semiconductor chip to be flexible is to make use of the capability to interrupt interconnects, or to electrically conductively connect interconnect ends to one another, by means of so-called fuses and anti-fuses. In the case of interconnects, which are in the form of structures in metallization levels, interruptions can be produced in an interconnect, for example, by using a laser beam, by means of which a part of the metallic interconnect is removed. However, the laser beam can interrupt only relatively coarse interconnect structures, so that a relatively large amount of surface area is consumed for a fuse implementation such as this.

The semiconductor components are generally connected in two or more metallization levels, which are arranged on the semiconductor body, are in each case structured, and are separated from one another by intermediate dielectrics. One variation of the connection of the integrated circuit components can also be provided by designing this connection in such a way that, by changing the structure, only a small number of metallization levels, and preferably only a single metallization level, can be used to provide the required different circuit functions by using an appropriately modified structuring mask. However, this is dependent on at least one mask being designed differently for the semiconductor chips that are processed on the same wafer, or on the relevant masks being replaced when changing the processed wafers. It is generally impossible to retrospectively change the interconnect structure in the metallization levels, since interconnects can be arranged in the upper metallization levels, which must never be removed or even only damaged.

SUMMARY OF THE INVENTION

Different interconnect structures can be produced via the circuit wiring starting of identical semiconductor chips. A passivation layer covers the uppermost metallization level and is provided with openings in which metal surfaces of the uppermost metallization level are exposed. An interconnect structure, including at least a portion that is located under one of the metal surfaces in the uppermost metallization level, is changed by means of a focused ion beam such that interconnects are connected to one another and/or at least one interconnect is interrupted. In other words, the method for formation of interconnect structures on semiconductor components by means of the focused ion beam changes the interconnect structures such that interconnects are connected to one another. Refinements of these embodiments are also shown and/or described.

According to embodiments of the invention, an interconnect structure is provided in the semiconductor chip and is changed by the use of a focused ion beam (FIB) by connecting interconnects to one another, and/or interrupting at least one interconnect. The relevant interconnect structure is preferably located immediately underneath an uppermost metallization level, which is intended primarily for providing connecting contact pads, for example for bonding wires or flip-chip mounting. The statement of the position of the metallization level as the uppermost metallization level depends on an alignment of the semiconductor chip with the substrate or semiconductor body right at the bottom. The uppermost metallization level is thus that metallization level that is furthest away from the semiconductor body.

The uppermost metallization level is covered by a passivation layer. This passivation layer contains openings in which metal surfaces of the uppermost metallization level are exposed. These metallic surfaces are in some cases used for electrical connection and are used as an etching stop layer in the area of the variable interconnect structure in order to make it possible to remove the passivation layer at this point without damaging interconnect structures that are located underneath it. The interconnect structure to be varied is located under at least some of the metal surfaces. The relevant metal surfaces therefore do not need to be provided for the electrical connection and, in particular, may be electrically insulated on all sides.

In order to apply the focused ion beam, an opening is produced in the relevant metal surface, so that the interconnect structure arranged underneath this can be changed by means of the focused ion beam. The ion beam allows material to be removed from the interconnect so that an electrically conductive connection is interrupted; however, the ion beam can also be used to deposit a metal, by means of which two mutually opposite ends of the interconnect structure are electrically conductively connected to one another, thus making a connection. In principle, the ion beam is used in the normal way. The circuit can thus be varied using a technical method that is already known per se from other applications.

One particular advantage of this structure of the semiconductor chip and of the associated method is that the upper passivation layer remains unchanged, with the exception of the relatively small openings over the metal surfaces, so that the semiconductor chip can be provided in the conventional manner with a housing, in particular with a covering encapsulation compound, and can be used in an application, after being treated with the focused ion beam. Since the interconnect structures to be changed are arranged closely below a respective metal surface, which is provided in the uppermost metallization level, the focused ion beam can be used without damaging the signal interconnects.

Typical dimensions for the metal surfaces are, for example, 10 μm×10 μm. The surface area is thus sufficiently large for focused ion beam (FIB) use, and the planar topology of the semiconductor component in this area likewise simplifies the use of FIB. A focused ion beam can also be used when interconnect structures are intended to be changed under which further structured metallization levels are located. The metal surfaces of the uppermost metallization level, under which the varied interconnect structures are arranged, may also be part of the voltage supply, since these large-area, broad supply lines are not significantly adversely affected by the opening of the metal surfaces in the area that is intended for the use of the ion beam. By way of example, supply voltages can be applied to the circuit via the uppermost metallization level. During the production of the semiconductor components, changed rules are used for the checking of the design (DRC, design rule check) in order to determine whether an interconnect structure, which is intended for FIB action is present, and whether this interconnect structure is arranged at the correct point in the chip wiring.

The following text contains a more detailed description of the semiconductor chip and of the method, with reference to FIGS. 1 to 3.

BRIEF DESCRIPTION OF THE DRAWINGS

For a more complete understanding of the present invention, and the advantages thereof, reference is now made to the following descriptions taken in conjunction with the accompanying drawing, in which.

The following list of reference symbols can be used in conjunction with the figures

| | |
|---|---|
| 1 | Uppermost metallization level |
| 2 | Metallization level provided underneath this |
| 3 | Passivation layer |
| 4 | Opening |
| 5 | Metal surface |
| 6 | Interconnect structure |
| 7 | Further metallization level |
| 8 | Intermediate dielectric |
| 9 | Transistor structure |
| 10 | Substrate |
| 11 | Area for interruption |
| 12 | Interconnect end |
| 13 | First connecting line |
| 14 | Second connecting line |
| 15 | Alignment projection |
| 16 | Conductor strip |
| 17 | Contact area |
| 18 | Vertical electrical connection |
| 19 | Connection |
| 20 | Interruption |
| 21 | Cutouts in metallization level 1 |
| 22 | The focused ion beam, F1B |

DETAILED DESCRIPTION OF ILLUSTRATIVE EMBODIMENTS

Figure 1:
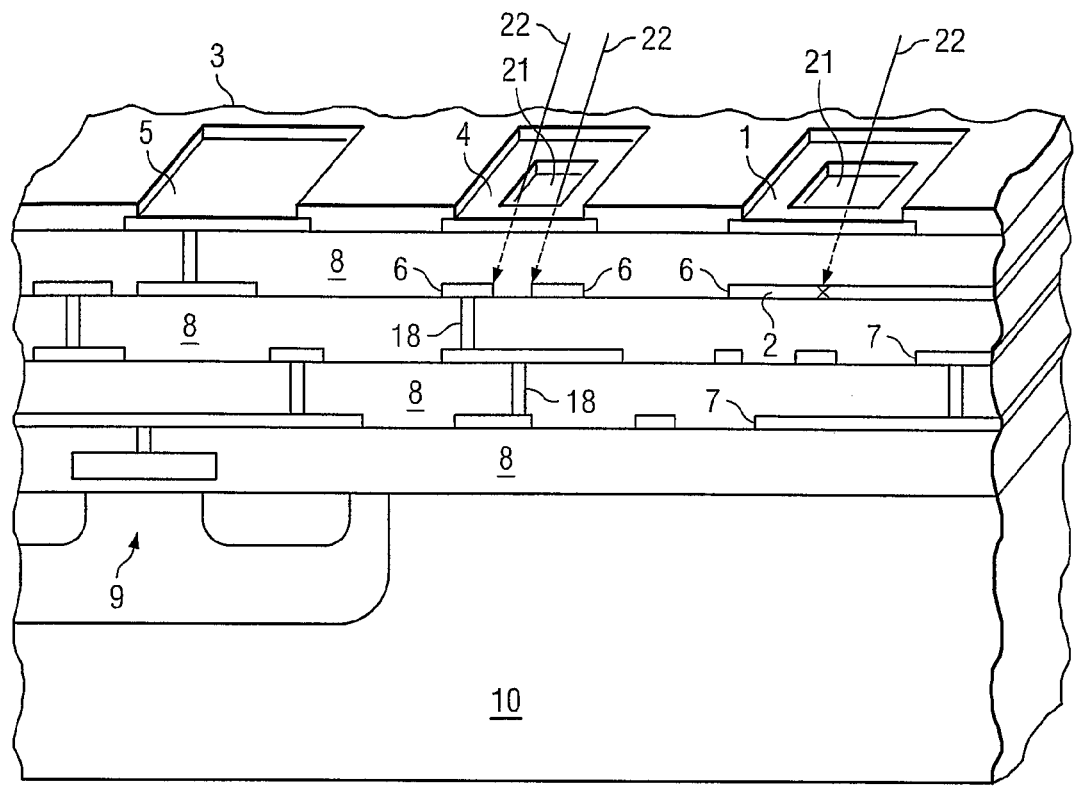
FIG. 1 shows an oblique sectional view through one exemplary embodiment of the semiconductor chip.

FIG. 1 shows a cross section through a semiconductor component with two or more metallization levels 1, 2, 7. Intermediate dielectric 8 provided between the metallization layers are arranged on a substrate 10, which is formed from a semiconductor body. The components of an electronic circuit are formed in the substrate, of which components the transistor structure 9 is indicated as an example. The upper face is covered with a passivation layer 3. The passivation layer 3 contains openings 4, in which metal surfaces 5 of the uppermost metallization level 1 are exposed. Some of these metal surfaces 5 are used for electrical connection, while others are also used as an etching stop layer for the production of the relevant openings 4 above the interconnect structures 6, which are intended to be changed by the FIB action.

The interconnect structures 6 to be changed are provided in a metallization level 2, which is provided underneath this, in the exemplary embodiment in FIG. 1 in the second-uppermost metallization level. In this example, components of the interconnect structure 6 with a gap between them, which can be closed by FIB action, are shown under the central opening that is illustrated in FIG. 1. A continuous interconnect of the interconnect structure 6 is located under the opening shown on the right and, for example, can be interrupted by FIB at the point indicated by the small cross. Vertical electrical connections 18 are located between the structured metallization levels, providing the wiring for the electronic circuit.

The interconnect structure 6 of the second-uppermost metallization level in this exemplary embodiment is changed by means of a focused ion beam in such a way that the wiring is matched to the respective requirements of the individual semiconductor chip. The semiconductor chip which, by way of example, is structured as shown in FIG. 1 can thus have its circuitry varied in a simple manner without having to remove the passivation layer 3 applied to its upper face. The additional openings 4, which are provided for this purpose, have dimensions that correspond approximately to those of the openings above the connecting contact pads, which are provided in any case for the external electrical connection. The metal surfaces 5 above the interconnect structures 6 to be changed can be connected to the circuit, for example, as part of the supply line for the supply voltage. These metal surfaces 5 may, however, also be electrically insulated on all sides, so that they form only a protective layer during the etching process by means of which the openings 4 are produced in the passivation layer 3. In order to allow the interconnect structure 6 under the respective metal surface 5 to be changed, the relevant metal surface is itself provided with a further opening 21 in order in this way to provide access for the focused ion beam 22 to the interconnect structure arranged underneath it.

Figure 2:
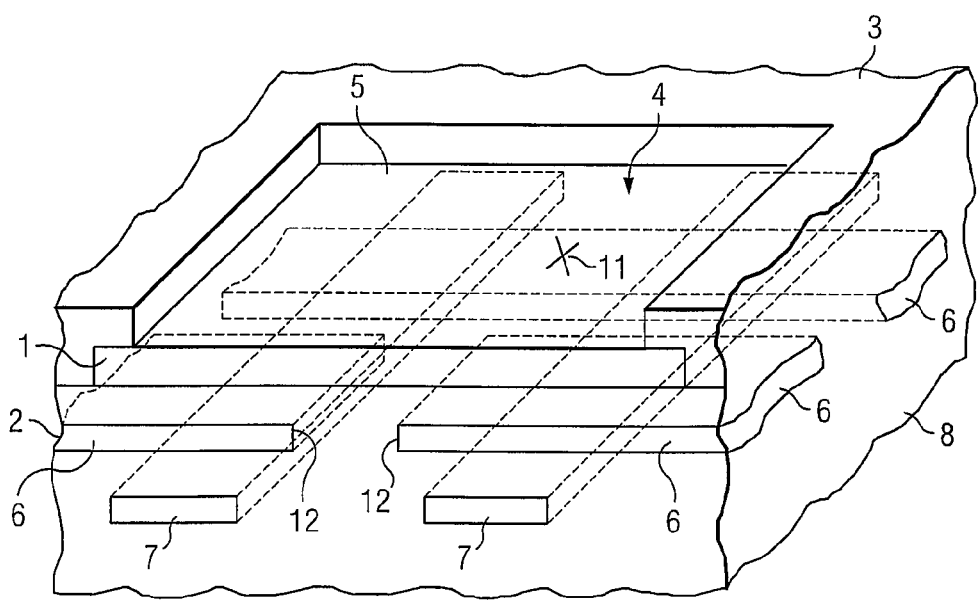
FIG. 2 shows an oblique section view of a semiconductor chip with the interconnect structure to be changed.

FIG. 2 shows a detail from a semiconductor chip according to the invention, in an area that is significant to this embodiment of the invention. This detail illustrates a metal surface 5 of the uppermost metallization level 1 with an opening 4 in the passivation layer 3 that is provided above it, in the form of an oblique section view. The interconnect structure 6 that is intended to be changed by means of a focused ion beam is arranged in a metallization level 2 which is provided underneath, in this case the second-uppermost metallization level 2, and is embedded in the intermediate metal dielectric 8. The concealed contours are shown by dashed lines. Further metallization levels 7 have further interconnects which, in this example, run transversely with respect to the interconnects in the interconnect structure 6.

The rear interconnect of the interconnect structure 6 as illustrated in the detail in FIG. 2 is, for example, interrupted in the area 11 that is intended for an interruption and is marked with a cross in FIG. 2. The front interconnect of the interconnect structure 6 is interrupted and has two interconnect ends 12, which are arranged opposite one another and which, when required, can be connected to one another by means of the focused ion beam. The illustration in FIG. 2 is not to scale; the structure of the conductors is indicated only in order to illustrate the principle. Furthermore, the dimensions do not necessarily correspond to the preferred embodiments. If required, interconnect structures located further below can also be processed instead of the second-uppermost metallization level by means of a focused ion beam. For example, in the area of the relevant metal surface 5, metallization levels that are arranged underneath it may have cutouts so that deeper metallization levels are reached with the focused ion beam. This also makes it possible to change interconnect structures in the lower metallization levels. However, a configuration of the semiconductor chip as shown in FIGS. 1 and 2 is preferable, in which the interconnect structure 6 that has been varied by means of FIB action is arranged below a cutout 21 directly underneath the metal surface 5.

Figure 3:
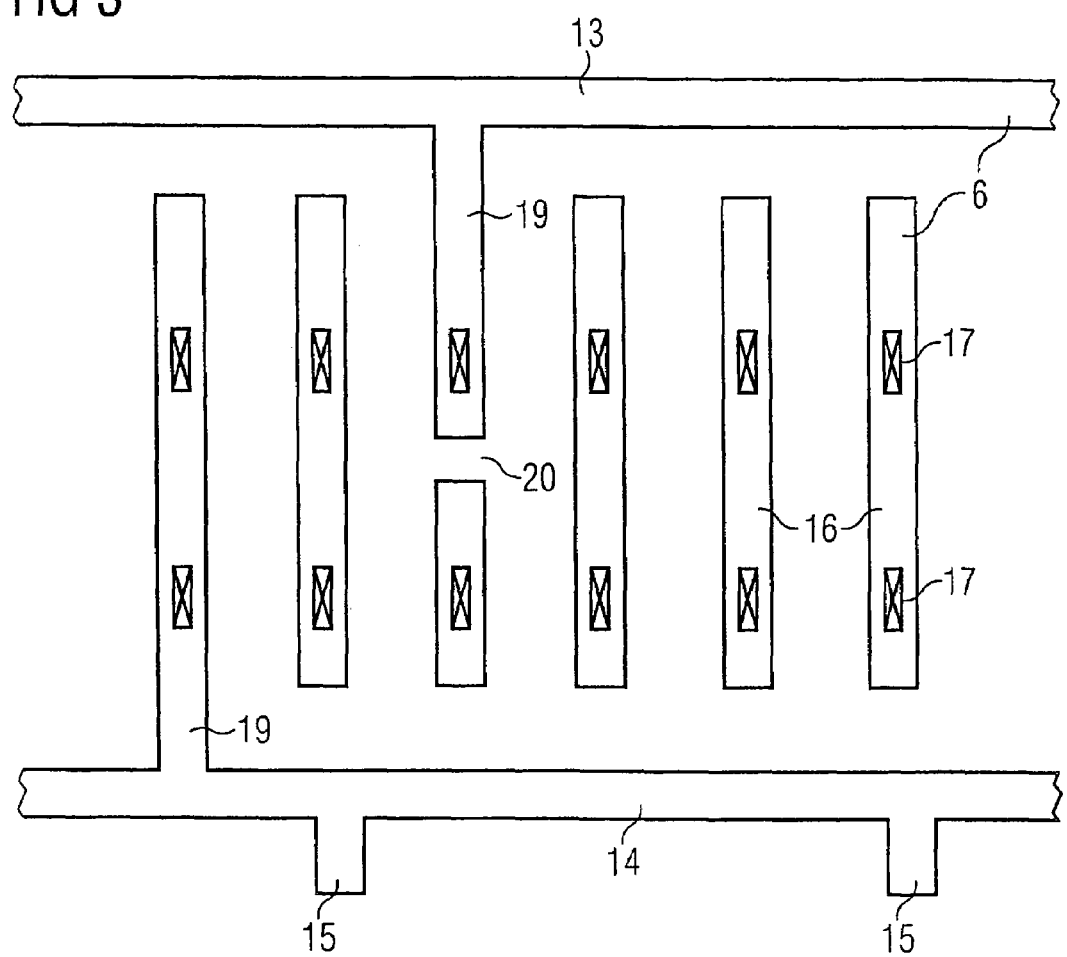
FIG. 3 shows the structure of an interconnect structure that has been changed by FIB.

FIG. 3 illustrates a way in which the interconnect structure 6 can be changed. FIG. 3 shows an interconnect structure 6, which in this case comprises a first connecting line 13, a second connecting line 14 with alignment projections 15, as well as conductor strips 16. The connecting lines may, for example, be lines for a high and a low signal level, or the connections for the supply voltage. The conductor strips 16 are located between the connecting lines and in this example are arranged parallel to one another, separated by the same distance. The conductor strips 16 typically have a width of approximately 300 nanometers, for example, and can typically be separated by about 500 nanometers, for example. The distance between the conductor strips 16 and the connecting lines is typically about 250 nanometers, for example. Contact areas 17 are located on the conductor strips and vertical electrically conductive connections that emerge from the plane of the drawing can be arranged on them, by means of which the interconnects in the interconnect structure 6 are connected to further metallization levels in the semiconductor chip.

One connection 19 is shown in the left-hand area of FIG. 3. A connection between the relevant conductor strip and the second connecting line 14 has been produced at this point by means of a focused ion beam. A connection 19 between a further conductor strip and the first connecting line 13 is shown in the upper area of FIG. 3. The same conductor strip 16 is provided with an interruption 20 in the center. The electrically conductive connection between the two contact areas 17 of this conductor strip has thus been interrupted in order in this way to change the wiring of the circuit. FIG. 3 shows, of course, only specific exemplary embodiments of the configuration of the interconnect structure 6 and of its modification by means of a focused ion beam.

The alignment projections 15, which are also illustrated in FIG. 3, may be intended to simplify the alignment of the ion beam after the opening of the metal surface that covers the interconnect structure 6. A position-finding process can be carried out in order to confirm which part of the interconnect structure 6 is located under the previously produced opening in the metal surface. This is made easier by markings, such as the alignment projections 15 that are shown. The alignment projections 15 may, furthermore, also be of different lengths, so that the position can be determined by measurement of this length, and the ion beam can easily be positioned on the conductor strips 16 to be varied. After the described change to the interconnect structure, the semiconductor chip is encapsulated, and can be used in the normal way.

What is claimed is:

1. A method of providing a selected one of two different electrical circuits from a single semiconductor chip comprising:

providing a semiconductor chip having formed therein a first one of said two different electrical circuits, said provided semiconductor chip comprising at least an upper metallization layer and a lower metallization layer supported by an insulating layer, said upper metallization layer defining an aperture there through and said lower metallization layer defining an interconnect structure including at least one of a conductive line for providing an electrical connection, or a pair of adjacent conductive lines electrically isolated from each other directly below said aperture in said upper metallization layer, said semiconductor top further comprising a passivation layer formed over said upper metallization layer and defining an opening therein, said opening above a portion of said upper metallization layer defining said aperture; and directing a FIB at said at least one of said conductive lines or said pair of adjacent conductive lines;

selectively melting a portion of said at least one of said conductive line to interrupt said electrical connection or melting portions of said pair of adjacent conductive lines to form an electrical connection therebetween.

2. The method of claim 1, further comprising forming vertical electrical connections that electrically couple the interconnect structure to one or more additional metallization levels above or below the interconnect structure.

3. The method of claim 1, wherein said conductive line is melted such that said electrical connection is interrupted.

4. The method of claim 1, wherein said pair of adjacent conductive lines is melted such that an electrical connection is formed between said pair.

5. The method of claim 4, wherein said conductive line is melted such that said electrical connection is interrupted.

* * * * *